(12) United States Patent
Ito et al.

(10) Patent No.: US 10,892,301 B2
(45) Date of Patent: Jan. 12, 2021

(54) PHOTO-ELECTRIC CONVERSION ELEMENT, SOLID-STATE IMAGING ELEMENT, AND ELECTRONIC APPARATUS

(71) Applicant: SONY SEMICONDUCTOR SOLUTIONS CORPORATION, Kanagawa (JP)

(72) Inventors: Takuya Ito, Kanagawa (JP); Yuta Hasegawa, Kanagawa (JP); Hideaki Mogi, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/347,638

(22) PCT Filed: Oct. 24, 2017

(86) PCT No.: PCT/JP2017/038245
§ 371 (c)(1),
(2) Date: May 6, 2019

(87) PCT Pub. No.: WO2018/092523
PCT Pub. Date: May 24, 2018

(65) Prior Publication Data
US 2019/0319072 A1    Oct. 17, 2019

(30) Foreign Application Priority Data
Nov. 16, 2016   (JP) ................................ 2016-222916

(51) Int. Cl.
*H01L 27/30* (2006.01)
*H01L 27/148* (2006.01)
(Continued)

(52) U.S. Cl.
CPC .......... *H01L 27/307* (2013.01); *H01L 27/148* (2013.01); *H01L 51/424* (2013.01); *H01L 51/441* (2013.01); *H04N 5/372* (2013.01)

(58) Field of Classification Search
CPC ...... H01L 27/307; H01L 27/148; H01N 5/372
See application file for complete search history.

(56) References Cited

U.S. PATENT DOCUMENTS

2005/0205903 A1   9/2005  Hioki
2011/0297234 A1   12/2011  Forrest et al.
(Continued)

FOREIGN PATENT DOCUMENTS

JP   2006-086493   3/2006
JP   2006-245285   9/2006
(Continued)

OTHER PUBLICATIONS

International Search Report prepared by the Japan Patent Office dated Nov. 29, 2017, for International Application No. PCT/JP2017/038245.

*Primary Examiner* — John A Bodnar
(74) *Attorney, Agent, or Firm* — Sheridan Ross P.C.

(57) ABSTRACT

To provide a photo-electric conversion element in which responsiveness and external quantum efficiency are improved. Provided is an organic photo-electric conversion element including: an organic photo-electric conversion layer sandwiched by a first electrode and a second electrode. The organic photo-electric conversion layer contains organic molecules of a quinacridone (QD) derivative and a subphthalocyanine (SubPc) derivative, and at least the quinacridone derivative out of the organic molecules is in random orientation.

8 Claims, 10 Drawing Sheets

(51) Int. Cl.
*H01L 51/44* (2006.01)
*H01L 51/42* (2006.01)
*H04N 5/372* (2011.01)

(56) References Cited

U.S. PATENT DOCUMENTS

2015/0206925 A1   7/2015  Takahashi et al.
2015/0311445 A1*  10/2015 Udaka ................. H01L 51/4253
                                                257/40
2016/0329379 A1   11/2016 Takahashi et al.
2017/0054089 A1   2/2017  Obana et al.
2017/0373258 A1*  12/2017 Obana ................. H01L 51/0072

FOREIGN PATENT DOCUMENTS

JP      2013-526082     6/2013
JP      2015-138861     7/2015
JP      2015-233117     12/2015
WO      WO 2014/073446  9/2016

* cited by examiner (a)

(b)

(a)  (b)

S701 — PERFORM XRD MEASUREMENT

S702 — OBTAIN HALF-WIDTH $B_{exp}$ BY PEAK RESOLUTION

S703 — OBTAIN APPARATUS COEFFICIENT CORRECTION (CORRECTION OF SPREAD OF X-RAYS) $B_i$

S704 — DERIVE GRAIN SIZE D BY SCHERRER'S EQUATION

PHOTO-ELECTRIC CONVERSION ELEMENT, SOLID-STATE IMAGING ELEMENT, AND ELECTRONIC APPARATUS

CROSS REFERENCE TO RELATED APPLICATIONS

This application is a national stage application under 35 U.S.C. 371 and claims the benefit of PCT Application No. PCT/JP2017/038245 having an international filing date of 24 Oct. 2017, which designated the United States, which PCT application claimed the benefit of Japanese Patent Application No. 2016-222916 filed 16 Nov. 2016, the entire disclosures of each of which are incorporated herein by reference.

TECHNICAL FIELD

The present technology relates to a photo-electric conversion element, a solid-state imaging element, and an electronic apparatus. More specifically, the present technology relates to a photo-electric conversion element including an organic photo-electric conversion layer that contains an organic material such as organic molecules, a solid-state imaging element, and an electronic apparatus.

BACKGROUND ART

These days, reduction in pixel size is being advanced in solid-state imaging apparatuses such as charge-coupled device (CCD) image sensors or complementary metal oxide semiconductor (CMOS) image sensors. Hence, the number of photons incident on a unit pixel is reduced, and accordingly sensitivity is reduced and a reduction in S/N ratio has occurred. Further, in a case where color filters of two-dimensionally arranged primary color filters of red, green, and blue are used for colorization, a red pixel experiences a reduction in sensitivity because light of green and blue is absorbed by the color filter. Further, when generating each color signal, interpolation processing is performed between pixels, and consequently what is called a false color is generated.

Thus, for example, Patent Literature 1 discloses an image sensor using organic photo-electric conversion films of a multiple-layer structure in which an organic photo-electric conversion film having sensitivity to blue light (B), an organic photo-electric conversion film having sensitivity to green light (G), and an organic photo-electric conversion film having sensitivity to red light (R) are sequentially stacked. This image sensor attempts to improve sensitivity by separately extracting signals of B/G/R from one pixel. Patent Literature 2 discloses an imaging element in which one organic photo-electric conversion film is formed and a signal of one color is extracted by the organic photo-electric conversion film, and signals of two colors are extracted by silicon (Si) bulk spectroscopy. In what is called a stacked imaging element (image sensor), which is described in each of Patent Literature 1 and Patent Literature 2, most incident light is caused to be photo-electrically converted and read out, and the efficiency of use of visible light is nearly 100%. Furthermore, color signals of three colors of R, G, and B are obtained in each light receiving unit, and therefore an image of high sensitivity and high resolution (with inconspicuous false colors) can be generated.

On the other hand, for example, Patent Literature 3 discloses a solid-state imaging element that contains quinacridone or a derivative thereof in a photo-electric conversion film for the purpose of further improvement in sensitivity, that is, improvement in external quantum efficiency (EQE) and spectral shape. Further, for example, Non-Patent Literature 1 reports an image sensor in which responsiveness is improved by forming a photo-electric conversion layer using a dimethylquinacridone and subphthalocyanines.

CITATION LIST

Patent Literature

Patent Literature 1: JP 2003-234460A
Patent Literature 2: JP 2005-303266A
Patent Literature 3: JP 2007-234651A

Non-Patent Literature

Non-Patent Literature 1: J. Phys. Chem. C, 2014, 118, 13424-13431

DISCLOSURE OF INVENTION

Technical Problem

However, the technologies proposed in Patent Literature 3 and Non-Patent Literature 1 are insufficient as the responsiveness of a photo-electric conversion element, and have a concern that an improvement in external quantum efficiency cannot be achieved.

Thus, the present technology has been made in view of such circumstances, and a main object of the present technology is to provide a photo-electric conversion element in which responsiveness and external quantum efficiency are improved.

Solution to Problem

The present inventors conducted extensive studies in order to solve the object described above, and succeeded in improving responsiveness and external quantum efficiency by adjusting the molecular orientation of organic molecules contained in an organic photo-electric conversion layer; thus, have completed the present technology.

That is, firstly, the present technology provides a photo-electric conversion element including: an organic photo-electric conversion layer sandwiched by a first electrode and a second electrode. The organic photo-electric conversion layer contains organic molecules of a quinacridone (QD) derivative and a subphthalocyanine (SubPc) derivative, and at least the quinacridone derivative out of the organic molecules is in random orientation.

In addition, the present technology provides a solid-state imaging element including at least: the photo-electric conversion element according to the present technology; and a semiconductor substrate. The photo-electric conversion element and the semiconductor substrate are stacked for each of a plurality of one-dimensionally or two-dimensionally arranged pixels.

Furthermore, the present technology provides an electronic apparatus including: the solid-state imaging element according to the present technology.

Advantageous Effects of Invention

According to the present technology, a photo-electric conversion element in which responsiveness and external quantum efficiency are improved can be provided. Note that

MODE(S) FOR CARRYING OUT THE INVENTION

Hereinbelow, preferred forms for implementing the present technology are described. The embodiments described below show only examples of typical embodiments of the present technology, and the scope of the present technology should not be construed as being limited by them.

Note that the description is given in the following order.
1. First embodiment (organic photo-electric conversion element)
1-1. Organic photo-electric conversion element
1-2. Method for manufacturing organic photo-electric conversion element
1-3. Orientation of quinacridone derivative
1-4. Method for assessing orientation properties
1-5. Method for deriving crystal grain size based on X-ray diffraction
1-6. Relationship between orientation parameter S and responsiveness
1-7. Relationship between crystal grain size and responsiveness
1-8. Examples
1-9. Comparative Examples
2. Second embodiment (solid-state imaging element)
2-1. Back-side illumination solid-state imaging element
2-2. Front-side illumination solid-state imaging element
3. Third embodiment (electronic apparatus)
4. Use examples of solid-state imaging element to which present technology is applied
5. Application example to endoscopic surgery system
6. Application example to mobile bodies <1. First Embodiment (Organic Photo-Electric Conversion Element)>

An organic photo-electric conversion element of a first embodiment according to the present technology will now be described using FIG. 1 to FIG. 9.

[1-1. Organic Photo-Electric Conversion Element]

Figure 1:
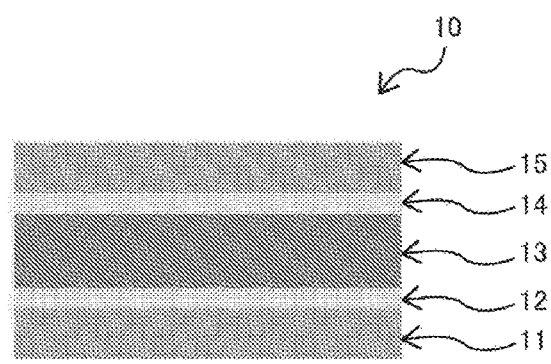
FIG. 1 is a cross-sectional view showing a configuration example of an organic photo-electric conversion element of a first embodiment to which the present technology is applied.

FIG. 1 is a cross-sectional view showing a configuration example of an organic photo-electric conversion element 10 of the first embodiment according to the present technology. As shown in FIG. 1, in the organic photo-electric conversion element 10, a first electrode (lower electrode) 11, a first buffer layer 12, an organic photo-electric conversion layer 13, a second buffer layer 14, and a second electrode (upper electrode) 15 are stacked in this order from the lower side to the upper side. The organic photo-electric conversion layer 13 contains one or more kinds of quinacridone (QD) derivative and one or more kinds of subphthalocyanine (SubPc) derivative.

The average inclination of part or all of the molecules of the quinacridone derivative in the organic photo-electric conversion layer 13 is random orientation. Here, the "random orientation" means that the angle θ between the average orientation of the transition dipole moments of the molecules and the normal-to-stacking-plane line n with respect to the plane of the organic photo-electric conversion layer 13 is 50° to 60°.

Further, examples of the kind of the quinacridone derivative usable in the organic photo-electric conversion layer 13 include 2,9-diethylquinacridone (EQD), 2,9-di-tert-butylquinacridone (BQD), N,N'-dimethylquinacridone (DMQD), N,N'-diphenylquinacridone (DPQD), N,N'-diphenyl-2,9-di-tert-butylquinacridone (BPQD), N-methylquinacridone (MMQD), N-methyl-2,9-dimethylquinacridone (TMQD), N-methyl-2,9-di-tert-butylquinacridone (BMQD), N-phenylquinacridone (MPQD), 2,9-di-n-butylquinacridone (2,9-DBQD), N,N'-di-n-butylquinacridone (N,N'-DBQD), and the like, but are not limited to these.

On the other hand, the subphthalocyanine derivative in the organic photo-electric conversion layer 13 exists in an amorphous state; also the average inclination of part or all of the molecules of the subphthalocyanine derivative is random orientation.

Examples of the kind of the subphthalocyanine derivative usable in the organic photo-electric conversion layer 13 include boron subphthalocyanine chloride (SubPc-Cl), boron subphthalocyanine-4-chlorophenoxide (SubPc-OPhCl), hexafluoroboron subphthalocyanine chloride (F6-SubPc-Cl), hexafluoroboron subphthalocyanine-4-chlorophenoxide (F6-SubPc-OPhCl), boron subphthalocyanine fluoride (SubPc-F), boron subphthalocyanine-4-pyridinoxide (SubPc-OPy), boron subphthalocyanine-4-fluorophenoxide (SubPc-OPhF), pentafluoroboron subphthalocyanine (SubPc-OC6F5), dodecafluoroboron subphthalocyanine chloride (F12-SubPc-Cl), and the like, but are not limited to these.

Although in the present embodiment an example in which one kind of quinacridone derivative and one kind of subphthalocyanine derivative are contained in the organic photo-electric conversion layer 13 is shown, as well as this, two or more kinds of quinacridone derivative or two or more kinds of subphthalocyanine derivative may be contained.

Each of the first electrode 11 and the second electrode 15 contains, for example, a light transmissive, transparent electrically conductive material, specifically indium tin oxide (ITO). The first electrode 11 may contain a tin oxide ($SnO_2$)-based material or a zinc oxide (ZnO)-based material. The tin oxide-based material refers to a material in which a dopant is added to tin oxide, and the zinc oxide-based material refers to, for example, an aluminum zinc oxide (AZO) in which aluminum (Al) is added as a dopant to zinc oxide, a gallium zinc oxide (GZO) in which gallium (Ga) is added as a dopant to zinc oxide, an indium zinc oxide (IZO) in which indium (In) is added as a dopant to zinc oxide, or the like. In addition, also IGZO, CuI, $InSbO_4$, ZnMgO, $CuInO_2$, $MgIn_2O_4$, CdO, $ZnSnO_3$, and the like may be used. The thickness of each of the first electrode 11 and the second electrode 15 may be an arbitrary thickness; for example, is 50 nm to 500 nm.

[1-2. Method for Manufacturing Organic Photo-Electric Conversion Element]

A method for manufacturing the organic photo-electric conversion element 10 will now be described.

First, the first electrode 11 is formed. The first electrode 11 is formed by, for example, forming an ITO film by the sputtering method, then patterning the ITO film by photolithography technology, and performing dry etching or wet etching.

Next, the first buffer layer 12 is formed as a film on the first electrode 11. For the film formation of the first buffer layer 12, the vapor deposition method is preferably used, but also the application method (including the casting method and the spin coating method) or the like may be used. The organic photo-electric conversion layer 13 is formed as a film on the first buffer layer 12. The second buffer layer 14 is formed as a film on the photo-electric conversion layer 13. For the film formation of the second buffer layer 14, the vapor deposition method is preferably used like in the film formation of the first buffer layer 12, but also the application method (including the casting method and the spin coating method) or the like may be used.

Finally, the second electrode 15 is formed as a film on the second buffer layer 14 by the vacuum vapor deposition method or the like; thus, the organic photo-electric conversion element 10 is manufactured.

[1-3. Orientation of Quinacridone Derivative]

Figure 2:
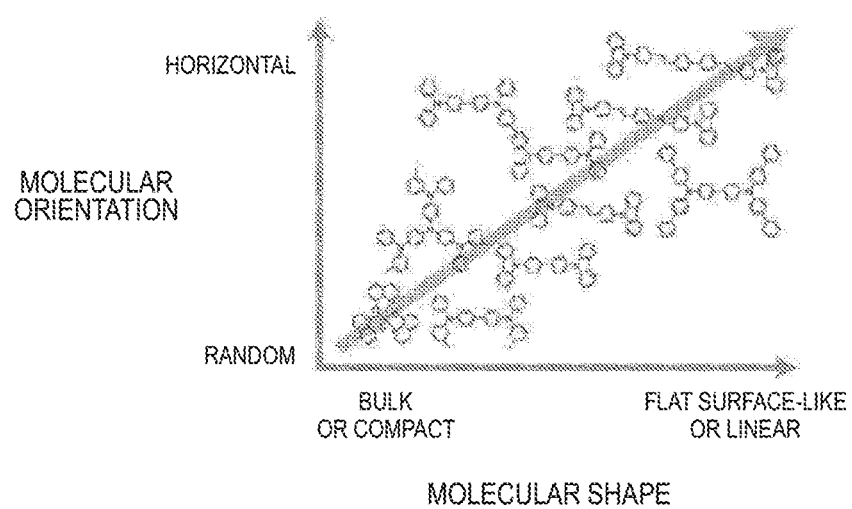
FIG. 2 is a graph showing a general relationship between molecular shape and molecular orientation of organic molecules.
Figure 3:
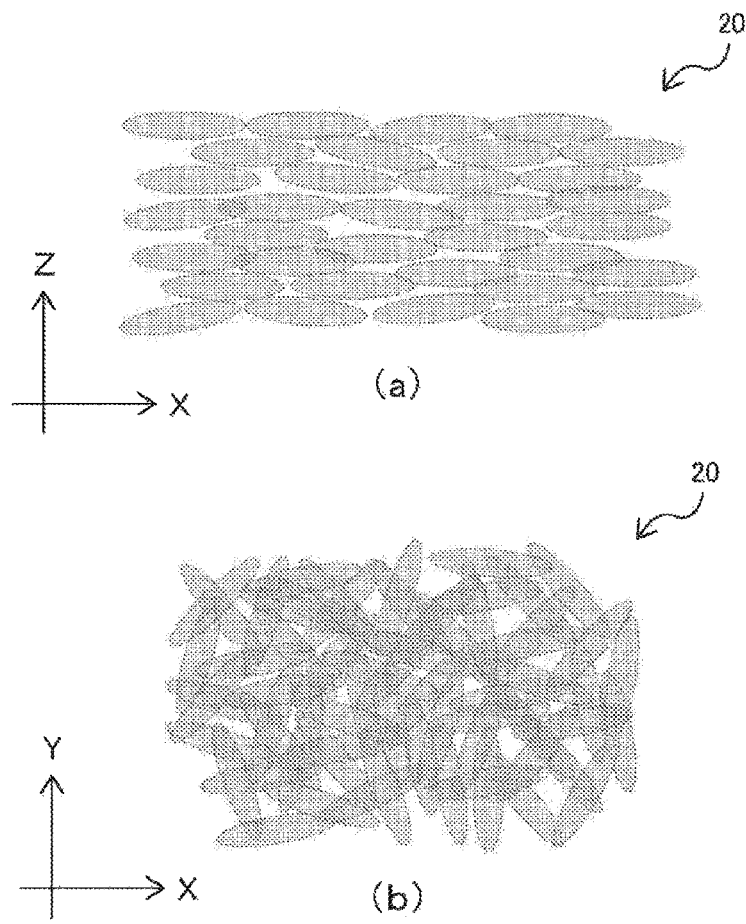
FIG. 3 is a schematic diagram showing orientation of a quinacridone derivative contained in an organic photo-electric conversion element of the first embodiment to which the present technology is applied. (a) shows a cross section of the quinacridone derivative, and (b) shows the quinacridone derivative as viewed from a normal-to-film plane direction.

FIG. 2 is a graph showing a general relationship between the molecular shape and the molecular orientation of organic molecules (the source: J. Mater. Chem., 2011, 21, 19187 FIG. 7). FIG. 3 is a schematic diagram showing the orientation of a quinacridone derivative contained in the organic photo-electric conversion element 10 of the present embodiment. FIG. 3(a) shows a cross section of the quinacridone derivative, and FIG. 3(b) shows the quinacridone derivative as viewed from the normal-to-film plane direction. The orientation of the quinacridone derivative will now be described using FIG. 2 and FIG. 3.

As shown in FIG. 3(a), in the quinacridone derivative, the major axis directions of quinacridone 20 are oriented to be aligned in the horizontal direction, as an example. Quinacridone 20 is oriented in the horizontal direction depending on film formation conditions, particularly in a case where it is formed as a film at low temperature. Further, as shown in FIG. 3(b), in the quinacridone derivative, quinacridone 20 is randomly orientated in the film plane, as an example.

Further, as shown in FIG. 2, the molecular orientation of an organic molecule generally depends on the molecular shape; hence, it is known that an organic molecule having a flat surface-like shape or a long, thin linear shape is more likely to be oriented. As an example, in a case of a quinacridone derivative, there is a tendency of being likely to be oriented in the horizontal direction, as shown in FIG. 3(a). Thus, in a case where molecules are oriented, it is presumed that, depending on the directions of molecules, a difference will occur in the time of movement of electrons and holes, and consequently the responsiveness of the photo-electric conversion element will be insufficient. Hence, in order to improve the responsiveness of the organic photo-electric conversion element 10 containing a quinacridone derivative, it is necessary to control the orientation properties and the grain size of the quinacridone derivative.

[1-4. Method for Assessing Orientation Properties]

Next, a method for assessing orientation properties is described. The assessment of orientation properties is performed by calculating an orientation parameter S and finding the degree of orientation on the basis of the orientation parameter S.

Figure 4:
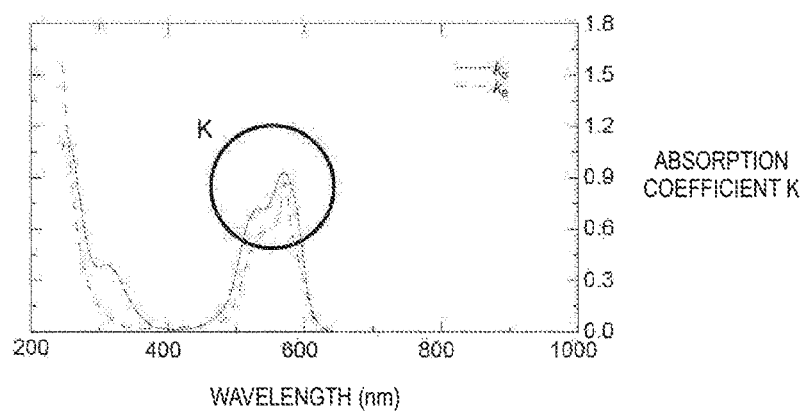
FIG. 4 is a graph showing an absorption coefficient K obtained from a result of fitting using measurement based on spectroscopic ellipsometry and an anisotropy model.

FIG. 4 is a graph showing an absorption coefficient K obtained from a result of fitting using measurement based on spectroscopic ellipsometry and an anisotropy model. The graph of the solid line in FIG. 4 shows the horizontal direction Ko of the absorption coefficient K, and the graph of the dotted line shows the vertical direction Ke of the absorption coefficient K. Further, the circle at the center of FIG. 4 shows the position of a maximum value of the absorption coefficient K. A method for finding an orientation parameter S will now be described using FIG. 4. The orientation parameter S can be calculated by using maximum values in the vertical direction (Ke) and the horizontal direction (Ko) of optical constants (absorption coefficients) K that are obtained by analysis using an anisotropy model on the basis of a measurement result of spectroscopic ellipsometry. The degree of molecular orientation can be found by calculating the orientation parameter S.

Specifically, if the angle between the direction of the normal-to-stacking-plane line n of the organic photo-electric conversion layer 13 and the direction of the transition dipole moment of quinacridone in the organic photo-electric conversion layer 13 is denoted by $\theta$ and the absorption coefficients K in the normal direction and the horizontal direction obtained by variable incident angle spectroscopic ellipsometry measurement of the organic photo-electric conversion layer 13 are denoted by Ke and Ko, respectively, the orientation parameter S of the quinacridone derivative can be found by Formula (I) below.

$$S=(1/2)\cdot(3\cos^2\theta-1)=(Ke-Ko)/(Ke+2Ko) \quad (1)$$

Form (1) above, a case of S=1 (θ=0) shows that the direction of the transition dipole moment is perpendicular to the plane of the organic photo-electric conversion layer 13, a case of S=0 (3 cos²θ−1=0) shows random orientation, and a case of S=−0.5 (θ=1) shows that the direction of the transition dipole moment is parallel to the plane of the organic photo-electric conversion layer 13.

Note that the measurement method based on spectroscopic ellipsometry mentioned above is a known technique; in the present technology, as well as the technique mentioned above, also the known polarized Raman spectroscopy method or the like may be used, for example.

Figure 5:
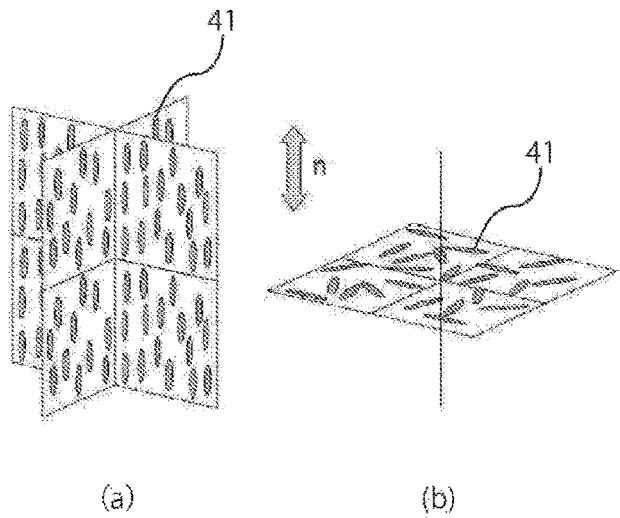
FIG. 5 is a conceptual diagram describing a concept of an orientation parameter of a quinacridone derivative. (a) shows an alignment state in a direction of a normal line n, and (b) shows a state where major axis directions of the quinacridone derivative are distributed in a plane perpendicular to the n-direction.

FIG. 5 is a schematic diagram describing the orientation parameter of grains each having shape anisotropy. FIG. 5(a) shows a state where all the major axis directions of shape-anisotropic grains 41 are aligned in the direction of the normal line n (the case of S=1), and FIG. 5(b) shows a state where the major axis directions of shape-anisotropic grains 41 are distributed in the plane of the organic photo-electric conversion layer perpendicular to the direction of the normal line n (the case of S=−0.5).

In the cases of FIGS. 5(a) and (b), the shape-anisotropic grain 41 is oriented in the direction of the normal line n or the direction of one plane; hence, a photo-electric conversion element that includes a photo-electric conversion layer containing shape-anisotropic grains 41 in either of such orientation states has insufficient responsiveness. This is presumed to be because, in a case where molecules are in an orientated state, a time difference occurs for electrons and holes to move, depending on the directions of molecules.

Figure 6:
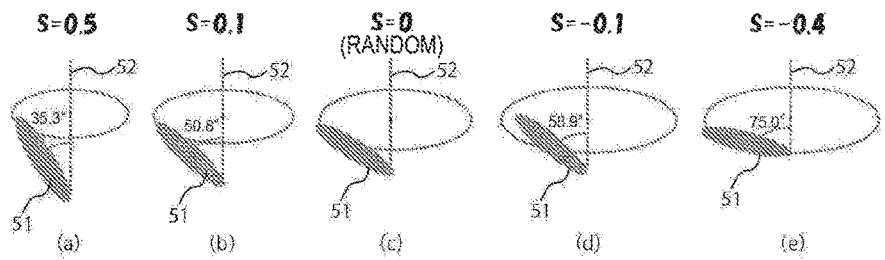
FIG. 6 is a diagram showing a relationship between an orientation parameter S and an average inclination of distribution of quinacridone. (a) shows a case where S=0.5, (b) shows S=0.1, (c) shows S=0 (random), (d) shows S=−0.1, and (e) shows S=−0.4.

FIG. 6 is a diagram showing a relationship between the orientation parameter S and the average inclination of distribution of quinacridone 51. FIG. 6(a) shows a case where S=0.5, FIG. 6(b) shows S=0.1, FIG. 6(c) shows S=0 (random), FIG. 6(d) shows S=−0.1, and FIG. 6(e) shows S=−0.4.

If the average inclination of distribution of quinacridone 51 is found by Formula (1) above, θ=35.3° when the orientation parameter S=0.5, θ=50.8° when S=0.1, θ=58.9° when S=−0.1, and θ=75.0° when S=−0.4, for example.

Note that the average inclination of distribution of quinacridone 51 can be found by $\Sigma n_i \cos^2\theta_i$, where the number of molecules of quinacridone 51 in the organic photo-electric conversion layer 13 is denoted by $n_i$ and the inclination of the i-th quinacridone 51 is denoted by $\theta_i$.

[1-5. Method for Deriving Crystal Grain Size Based on X-Ray Diffraction]

Figure 7:
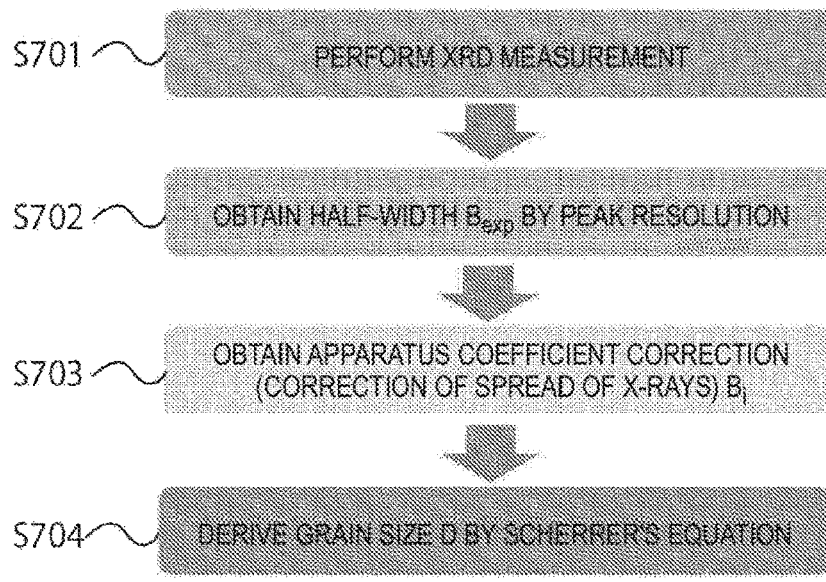
FIG. 7 is a flow chart showing a method for deriving a crystal grain size based on X-ray diffraction.

FIG. 7 is a flow chart showing a method for deriving a crystal grain size based on X-ray diffraction (XRD). An example of a method for deriving the crystal grain size of a quinacridone derivative will now be described using FIG. 7.

In step S701, XRD measurement is started using an X-ray diffraction apparatus aligned (adjusted) for a parallel method (thin film method). For example, the angle of incidence of X-rays is fixed to less than or equal to 1° with respect to the surface of the sample, and the angle 2θ of a detector is measured through a range of 3° to 35°.

In step S702, the full width at half maximum (FWHM) $B_{exp}$ is found by peak resolution using the known Peason VII or pseudo-Voigt function.

In step S703, apparatus coefficient correction (the correction of the spread of X-rays) $B_i$ is found from the measurement of a commercially available standard sample with a crystal grain size of more than or equal to 100 nm. The correction $B_i$ of the spread of X-rays can be found by using Formula (2) below.

$$\beta=(B_{exp}^2-B_i^2)^{1/2} \quad (2)$$

Here, β represents the spread (rad) of diffracted rays derived from a crystallite, $B_{exp}$ represents the angle (rad) of diffraction obtained by measurement, and $B_i$ represents the spread (rad) of diffracted rays derived from the apparatus.

In step S704, the grain size Dnm can be derived by Scherrer's equation (3) below, as an example.

$$D=K\lambda/\beta\cos\theta \quad (3)$$

Here, K represents the Scherrer constant, 0.94, λ represents the wavelength (nm) of X-rays, β represents the spread (rad) of diffracted rays, and θ represents the angle (rad) of diffraction.

Although in the present embodiment the grain size Dnm is derived by the technique mentioned above, the derivation method is not limited to this, and may be any method as long as it is a technique capable of finding the grain size Dnm.

[1-6. Relationship between Orientation Parameter S and Responsiveness]

Figure 8:
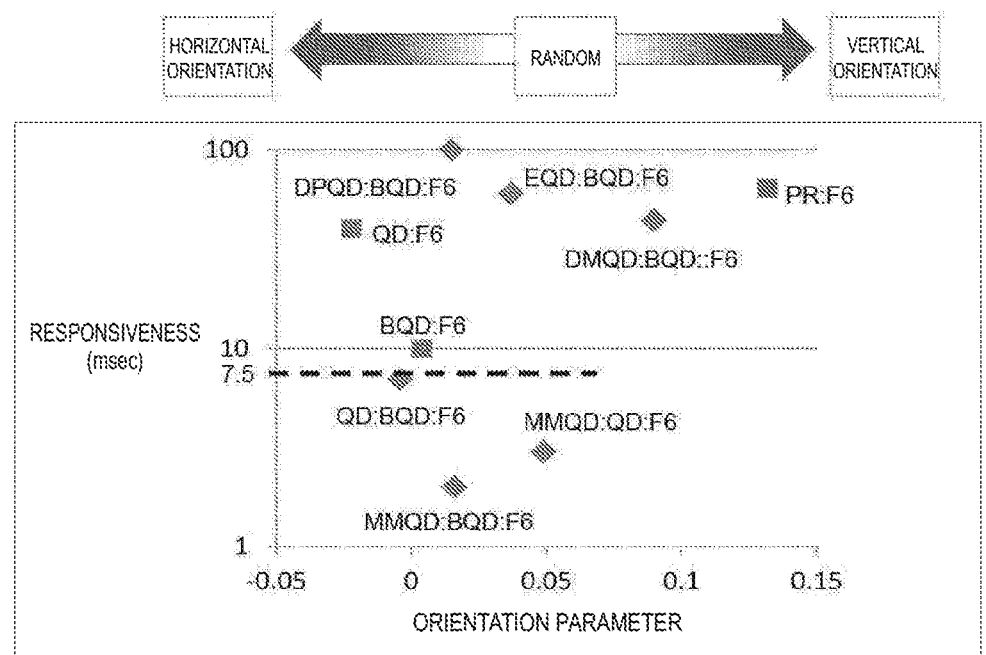
FIG. 8 is a diagram showing a relationship between an orientation parameter and responsiveness in accordance with the kind of organic molecules.

FIG. 8 is a diagram showing a relationship between the orientation parameter S and responsiveness in accordance with the kind of organic molecules in a case of random orientation. A value of the orientation parameter S whereby responsiveness is made good will now be described using FIG. 8.

In FIG. 8, the horizontal axis represents the orientation parameter S, and the vertical axis represents responsiveness (msec). Here, in a case where the orientation parameter S is 0, the orientation is random orientation; as the orientation parameter S becomes smaller from 0, the orientation becomes the horizontal orientation more; as the orientation parameter S becomes larger from 0, the orientation becomes the vertical orientation more. Further, it is indicated that, as the numerical value of responsiveness becomes smaller, the responsiveness becomes better. That is, it is indicated that, as the numerical value becomes larger, afterimages disappear more quickly and remain less easily. Note that the black square mark in FIG. 8 indicates a binary system (containing two kinds of organic molecules), and the black rhombus mark indicates a tertiary system (containing three kinds of organic molecules).

As shown in FIG. 8, in the range of −0.05≤S≤0.15, the responsiveness is shown to be good values of less than or equal to 100 (msec). Specifically, for example, if the orientation parameter S=around 0, BQD:F6, which is a binary system, has a responsiveness of 10.0 (msec), and QD:BQD:F6, which is a tertiary system, has a responsiveness of 7.5 (msec) and shows a very good value.

[1-7. Relationship between Crystal Grain Size and Responsiveness]

Figure 9:
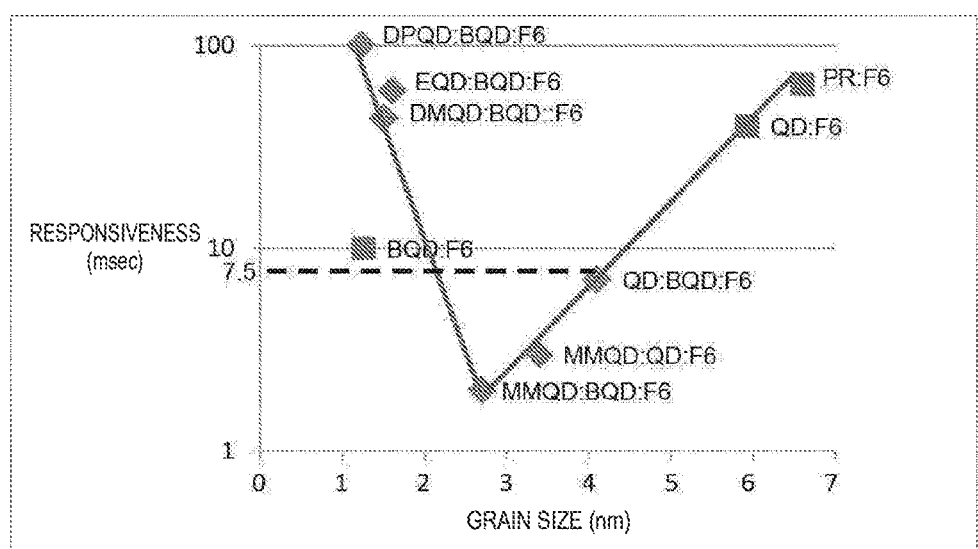
FIG. 9 is a diagram showing a relationship between crystal grain size and responsiveness in accordance with the kind of organic molecules.

FIG. 9 is a diagram showing a relationship between crystal grain size and responsiveness in accordance with the kind of organic molecules in a case of random orientation. A magnitude of crystal grain size whereby responsiveness is made good will now be described using FIG. 9.

In FIG. 9, the horizontal axis represents crystal grain size (nm), and the vertical axis represents responsiveness (msec). Further, like in FIG. 8, the black square mark in FIG. 9 indicates a binary system, and the black rhombus mark indicates a tertiary system.

As shown in FIG. 9, as the crystal grain size transitions from both of around 1 nm and around 6.5 nm toward around 2 to 3 nm, the responsiveness becomes better. Thus, in the present embodiment, the responsiveness is shown to be good values of less than or equal to 10 (msec) in a case of random orientation and a crystal grain size of approximately 2 to 5 nm. In particular, a peak of responsiveness exists at approximately 2 to 3 nm, and the responsiveness is best around this value. Specifically, for example, if the crystal grain size is around approximately 2.7 nm, the responsiveness of MMQD:BQD:F6, which is a tertiary system, shows a peak of approximately 2 to 3 (msec).

Thus, in the present embodiment, the responsiveness of the organic photo-electric conversion element 10 of the present embodiment can be made good in a case where the orientation parameter S of each of the quinacridone derivative and the subphthalocyanine derivative is S=around 0, that is, random orientation, or in a case where the crystal grain size of each of the quinacridone derivative and the subphthalocyanine derivative is approximately 2 to 5 nm. In particular, the responsiveness of the organic photo-electric conversion element 10 can be made better in a case where the quinacridone derivative and the subphthalocyanine derivative are in random orientation and the crystal grain size of each of the quinacridone derivative and the subphthalocyanine derivative is approximately 2 to 5 nm. Furthermore, by reducing the grain size of the quinacridone derivative (less than or equal to 5 nm), the amount of interface traps and the amount of defects in the organic photo-electric conversion layer can be reduced.

Here, charge mobility is greatly reduced due to a grain boundary (crystal grain boundary) occurring in an organic photo-electric conversion layer 13 of a polycrystal. This is because an electron trap and a hole barrier are formed at a grain boundary, and consequently charge is hindered from moving due to the decrease of the overlap of atomic orbitals. Thus, in order to improve charge mobility (carrier mobility), it is important to create a uniform structure in which a grain boundary is not formed. Then, if the molecular orientation of organic molecules in the organic photo-electric conversion layer 13 is strong, although π orbitals are likely to overlap, a crystal is likely to be produced, and a grain boundary is likely to be formed; even in random orientation, a grain boundary is formed in a case where the crystal grain size is large.

However, from the relationship between crystal grain size and responsiveness shown in FIG. 9, it can be said that a distinctive grain boundary is not formed in a microcrystalline-amorphous region where the crystal grain size is smaller than 5 nm. Further, from FIG. 8 and FIG. 9, it can be said that a high mobility has been obtained at crystal grain sizes of 2 to 3 nm and in random orientation; thus, the amount of interface traps and the amount of in-film defects can be reduced by creating a random structure with a small grain size. Note that, if the crystal grain size is less than or equal to 2 nm, the organic molecules come close to an amorphous state; consequently, the charge mobility is reduced, and accordingly the responsiveness is reduced.

[1-8. Examples]

As shown below, photo-electric conversion elements according to the first embodiment of the present technology were produced, and the photo-electric conversion efficiency (external quantum efficiency), the responsiveness, and the crystal grain size of the quinacridone derivative were assessed.

(Experiment 1)

First, a glass substrate equipped with an ITO electrode was cleaned by UV/ozone treatment. Note that the film thickness of the ITO film corresponding to the lower electrode (first electrode) on the glass substrate was 50 nm.

Next, the glass substrate was put into an organic vapor deposition apparatus, the pressure was reduced to less than or equal to 1×10 Pa, and N-methyl-2,9-di-tert-butylquinacridone (BMQD), 2,9-di-tert-butylquinacridone (BQD), and hexafluoroboron subphthalocyanine chloride (F6-SubPc-Cl) were simultaneously deposited by vapor deposition using a resistance heating method while a substrate holder was rotated. The vapor deposition rate (film formation rate) was set to 0.025 nm/second, 0.025 mu/second, and 0.05 nm/second; thus, an organic photo-electric conversion layer with a total thickness of 100 nm was formed as a film.

Further, AlSiCu was formed as a film with a film thickness of 100 nm on the organic photo-electric conversion layer mentioned above by the vapor deposition method, and the upper electrode (second electrode) was formed. By the above production method, a photo-electric conversion element having a 1 mm×1 mm photo-electric conversion region was produced.

In addition, as Examples 2 to 6, photo-electric conversion elements were produced using a similar method to Example 1 by using the following substances: in place of N-methyl-2,9-di-tert-butylquinacridone (BMQD) of Example 1, N-methyl-2,9-dimethylquinacridone (TMQD; Example 2), N-methylquinacridone (MMQD; Example 3), and N-phenylquinacridone (MPQD; Example 4); TMQD in place of RMQD of Example 1 and hexafluoroboron subphthalocyanine-4-chlorophenoxide (F6-SubPc-OPh) in place of hexafluoroboron subphthalocyanine chloride (F6-SubPc-Cl) of Example 1 (Example 5); and N-methylquinacridone (MMQD) in place of BMQD of Example 1 and quinacridone (QD) in place of 2,9-di-tert-butylquinacridone (BQD) of Example 1 (Example 6) (see Table 1). Table 1 shows the results of assessment of the external quantum efficiency (EQE), the responsiveness, and the crystal grain size of the quinacridone derivative of each of Examples 1 to 6, each of which uses quinacridone derivatives of an HR+HH-type structure.

[Method for Assessing External Photo-Electric Conversion Efficiency]

The assessment of the external photo-electric conversion efficiency was performed by using a semiconductor parameter analyzer. Specifically, the external photo-electric conversion efficiency was calculated from the light current value and the dark current value in a case where the amount of light applied to the photo-electric conversion element from a light source via a filter was set to 1.62 μW/cm$^2$ and the bias voltage applied between the electrodes was set to −1 V.

[Method for Assessing Responsiveness]

The assessment of the responsiveness was performed by using a semiconductor parameter analyzer to measure the speed at which the light current value observed during light irradiation fell from when the light irradiation was stopped. Specifically, the amount of light applied to the photo-electric conversion element from a light source via a filter was set to 1.62 μW/cm$^2$, and the bias voltage applied between the electrodes was set to −1 V. In this state, a steady current was observed, then the light irradiation was stopped, and the manner in which the current was attenuated was observed. Subsequently, the dark current value was subtracted from the obtained current-time curve. Using the current-time curve thus obtained, the time it takes for the current value after the stop of the light irradiation to be attenuated to 3% of the current value observed in the steady state was calculated as an index of responsiveness.

[Method for Assessing Orientation Properties]

The measurement of the optical anisotropy was performed with a spectroscopic ellipsometer using an anisotropy model, and the orientation parameter S was calculated from a peak of absorption of 500 nm to 600 nm. The orientation parameter S indicates completely vertical orientation by S=1, random orientation by S=0, and completely horizontal orientation by S=−0.5. Since optical absorption is detected, the orientation direction does not necessarily mean the major axis direction of the molecule, but means orientation in the direction of the transition dipole moment of each molecule. Using M2000 manufactured by J. A. Woollam Co., Inc. as the spectroscopic ellipsometer, measurement was performed at intervals of 5° from 55° to 75° through a wavelength range of 245 nm to 1000 nm. Note that, for the sample production method for spectroscopic ellipsometry, a film with a thickness of 50 nm may be formed at a film formation rate of 1 Å/sec on a 1-inch quartz substrate by the vacuum vapor deposition method, as an example.

[Method for Assessing Grain Size]

Using an X-ray diffraction apparatus (RINT-TTRII, manufactured by Rigaku Corporation) aligned for a parallel method (thin film method), measurement was performed through a range of angle 2θ of 3° to 35°, with a divergence slit set to 1 mm, a divergence vertical slit set to 5 mm, and the angle of incidence fixed to 0.1° to 0.2°. The background was removed, then the half-width was found by peak resolution using the Peason VII function, the correction of the apparatus coefficient (the spread of X-rays) was performed, and then the grain size was calculated from the half-width by using Scherrer's equation. For the correction of the apparatus coefficient, the correction of the spread of X-rays was performed by using the half-width of Si grains with sufficiently large grain sizes, and the average value of the half-widths of the peaks of the Si grains was found to be 0.73° ($B_i$); and the correction of the apparatus coefficient was performed by using the formula $(B\ exp^2 - B_i^2)^{1/2}$.

TABLE 1

| | Classification of quinacridone material used | Constituent substances of photo-electric conversion layer | | | External quantum efficiency (in case where Example 1 is set to 1) | Time of fall of signal intensity from 100 to 3% (in case where Example 1 is set to 1) | Grain size of QD derivative | Orientation parameter S |
|---|---|---|---|---|---|---|---|---|
| Example 1 | HR + HH | BMQD | BQD | F6SubPcCl | 1 | 1 | 2.5 | −0.008 |
| Example 2 | HR + HH | TMQD | BQD | F6SubPcCl | 1 | 3.5 | 2.2 | 0.05 |
| Example 3 | HR + HH | MMQD | BQD | F6SubPcCl | 0.8 | 2 | 2.7 | 0.016 |
| Example 4 | HR + HH | MPQD | BQD | F6SubPcCl | 0.5 | 4 | 3.6 | −0.06 |
| Example 5 | HR + HH | TMQD | BQD | F6SubPcOPh | 0.9 | 2.5 | 3.0 | 0.03 |
| Example 6 | HR + HH | MMQD | QD | F6SubPcCl | 0.8 | 3 | 3.4 | 0.049 |

From Table 1, first, it has been found that, if the crystal grain size of the quinacridone derivative is in the range of approximately 2.2 nm to 3.6 nm, the responsiveness is good. Next, it has been found that, if the crystal grain size of the quinacridone derivative is in the range of approximately 2.2 nm to 3.5 nm, both the external quantum efficiency and the responsiveness are good. Further, it has been found that, if the absolute value of the orientation parameter S is |S|≤0.05, both the external quantum efficiency and the responsiveness are good.

(Experiment 2)

Next, photo-electric conversion elements (Examples 7 to 9) were produced using a similar method to Example 1 above except for the configuration of the organic photo-electric conversion layer, and the external quantum efficiency (EQE), the responsiveness, and the crystal grain size of the quinacridone derivative thereof were assessed as follows. As Examples 7 to 9, photo-electric conversion elements were produced using a similar method to Example 1 by using the following substances: in place of N-methyl-2,9-di-tert-butylquinacridone (BMQD) of Example 1, N,N'-diphenylquinacridone (DPQD; Example 7), N,N'-diphenyl-2,9-di-tert-butylquinacridone (BPQD; Example 8), and 2,9-di-tert-butylquinacridone (BQD; Example 9); and quinacridone in all of Examples 7 to 9 in place of 2,9-di-tert-butylquinacridone (BQD) of Example 1 (see Table 2). Table 2 shows the assessment results of Examples 7 to 9, each of which uses two kinds of quinacridone derivative other than the HR+HH-type structure. Note that the results of assessment of the EQE and the responsiveness are shown as relative values with the results of Example 1 set to a standard value of 1.

TABLE 2

| | Classification of quinacridone material used | Constituent substances of photo-electric conversion layer | | | External quantum efficiency (in case where Example 1 is set to 1) | Time of fall of signal intensity from 100 to 3% (in case where Example 1 is set to 1) | Grain size of QD derivative | Orientation parameter S |
|---|---|---|---|---|---|---|---|---|
| Example 7 | RR + HH | DPQD | QD | F6SubPcCl | 0.7 | 4.5 | 3.9 | 0.05 |
| Example 8 | RR + HH | BPQD | QD | F6SubPcCl | 0.7 | 4 | 3.8 | −0.01 |
| Example 9 | HH + HH | BQD | QD | F6SubPcCl | 0.8 | 7 | 4.1 | −0.004 |

In Experiment 2, the crystal grain size of the quinacridone derivative is set larger than in Experiment 1. From Table 2, it has been found that, if the crystal grain size of the quinacridone derivative is in the range of less than or equal to 4.1 nm, although both the external quantum efficiency and the responsiveness are slightly inferior to those of Experiment 1, both the external quantum efficiency and the responsiveness are good after all.

(Experiment 3)

Next, photo-electric conversion elements (Examples 10 and 11) were produced using a similar method to Example 1 above except for the configuration of the organic photo-electric conversion layer, and the external quantum efficiency (EQE), the responsiveness, and the crystal grain size of the quinacridone derivative thereof were assessed as follows. However, the film formation rate in Experiment 3 is 0.05 nm/second and 0.05 nm/second. As Examples 10 and 11, photo-electric conversion elements were produced using a similar method to Example 1 by using, in place of N-methyl-2,9-di-tert-butylquinacridone (BMQD) of Example 1, N-methylquinacridone (MMQD) (Example 10) and N,N'-dimethylquinacridone (DMQD) (Example 11), and not using 2,9-di-tert-butylquinacridone (BQD) of Example 1 in either of Examples 10 and 11 (see Table 3). Table 3 shows the assessment results of Examples 10 and 11, each of which uses one kind of quinacridone derivative other than the HR+HH-type structure. Note that the results of assessment of the EQE and the responsiveness are shown as relative values with the results of Example 1 set to a standard value of 1.

to approximately 2.5 nm and the absolute value of the orientation parameter S is |S|≤0.05. However, it has been found that, in the case where the number of kinds of quinacridone derivative is one, the external quantum efficiency is reduced even if the crystal grain size and the value of the orientation parameter S of the quinacridone derivative are favorable conditions.

[1-9. Comparative Examples]

As shown below, photo-electric conversion elements (Comparative Examples 1 to 8) were produced using a similar method to Example 1 above except for the configuration of the organic photo-electric conversion layer, and the external quantum efficiency (EQE), the responsiveness, and the crystal grain size of the quinacridone derivative thereof were assessed as follows.

(Experiment 4)

As Comparative Examples 1 to 4, as the quinacridone derivative, only quinacridone was used in Comparative Examples 1 to 3, and 2,9-dimethylquinacridone (PR122) and 2,9-di-tert-butylquinacridone (BQD) were used in Comparative Example 4. Further, as the subphthalocyanine derivative, boron subphthalocyanine chloride (SubPc-Cl) was used in Comparative Example 1, hexafluoroboron subphthalocyanine-4-chlorophenoxide (SubPc-OPh) in Comparative Example 2, and hexafluoroboron subphthalocyanine chloride (F6-SubPc-Cl) in Comparative Examples 3 and 4. Then, photo-electric conversion elements were produced using a similar method to Example 1 (see Table 4). Table 4 shows the assessment results of Comparative

TABLE 3

| | Classification of quinacridone material used | Constituent substances of photo-electric conversion layer | | | External quantum efficiency (in case where Example 1 is set to 1) | Time of fall of signal intensity from 100 to 3% (in case where Example 1 is set to 1) | Grain size of QD derivative | Orientation parameter S |
|---|---|---|---|---|---|---|---|---|
| Example 10 | HR | MMQD | — | F6SubPcCl | 0.4 | 2.5 | 2.5 | −0.03 |
| Example 11 | RR | DMQD | — | F6SubPcCl | 0.36 | 5 | 2.1 | −0.05 |

In Experiment 3, only one kind of quinacridone derivative is used. From Table 3, it has been found that, even in a case where the number of kinds of quinacridone derivative is one, the responsiveness is good if the crystal grain size of the quinacridone derivative is in the range of less than or equal Examples 1 to 4, in which the crystal grain size or the orientation parameter S is too large and the responsiveness is bad. Note that the results of assessment of the EQE and the responsiveness are shown as relative values with the results of Example 1 set to a standard value of 1.

TABLE 4

| | Classification of quinacridone material used | Constituent substances of photo-electric conversion layer | | | External quantum efficiency (in case where Example 1 is set to 1) | Time of fall of signal intensity from 100 to 3% (in case where Example 1 is set to 1) | Grain size of QD derivative | Orientation parameter S |
|---|---|---|---|---|---|---|---|---|
| Comparative Example 1 | HH | QD | — | SubPcCl | 0.96 | 500 | 6.9 | −0.145 |
| Comparative Example 2 | HH | QD | — | SubPcOPh | 0.96 | 220 | 4.8 | −0.138 |
| Comparative Example 3 | HH | QD | — | F6SubPcCl | 0.84 | 40 | 5.9 | −0.022 |
| Comparative Example 4 | HH + HH | PR122 | BQD | F6SubPcCl | 0.7 | 17 | 6 | 0.15 |

From Table 4, it has been found that, if the crystal grain size of the quinacridone derivative is in the range of 4.8 nm to 6.9 nm or the absolute value of the orientation parameter S is |S|≤0.15, the external quantum efficiency is good. However, it has been found that, in a case of the conditions of Experiment 4, the responsiveness is extremely reduced as compared to Examples 1 to 11 above, because the crystal grain size of the quinacridone derivative or the orientation parameter S is too large.

(Experiment 5)

As Comparative Examples 5 to 8, as the quinacridone derivative, only 2,9-di-tert-butylquinacridone (BQD) was used in Comparative Example 5, N,N'-dimethylquinacridone (DMQD) and 2,9-di-tert-butylquinacridone (BQD) in Comparative Example 6, N,N'-diphenylquinacridone (DPQD) and 2,9-di-tert-butylquinacridone (BQD) in Comparative Example 7, and 2,9-diethylquinacridone (EQD) and 2,9-di-tert-butylquinacridone (BQD) in Comparative Example 8. Further, as the subphthalocyanine derivative, hexafluoroboron subphthalocyanine chloride (F6-SubPc-Cl) was used in all of Comparative Examples 5 to 8. Then, photo-electric conversion elements were produced using a similar method to Example 1 (see Table 5). Table 5 shows the assessment results of Comparative Examples 5 to 8, in which the crystal grain size is too small and the responsiveness is bad. Note that the results of assessment of the EQE and the responsiveness are shown as relative values with the results of Example 1 set to a standard value of 1.

responsiveness is reduced as compared to Examples 1 to 11 above, because the crystal grain size of the quinacridone derivative is too small.

From the results of Experiments 1 to 5 above, it has been found that the responsiveness and the external quantum efficiency of the photo-electric conversion element are improved by the fact that a quinacridone derivative and a subphthalocyanine derivative each having random orientation and a crystal grain size in the range of approximately 2 nm to 5 nm are contained in the photo-electric conversion layer included in the photo-electric conversion element. Further, from the results of Experiments 1 to 3, it has been found that the responsiveness and the external quantum efficiency can be further improved by the fact that the photo-electric conversion layer contains two kinds of the quinacridone derivatives mentioned above.

<2. Second Embodiment (Back-Side Illumination Solid-State Imaging Element)>

Figure 10:
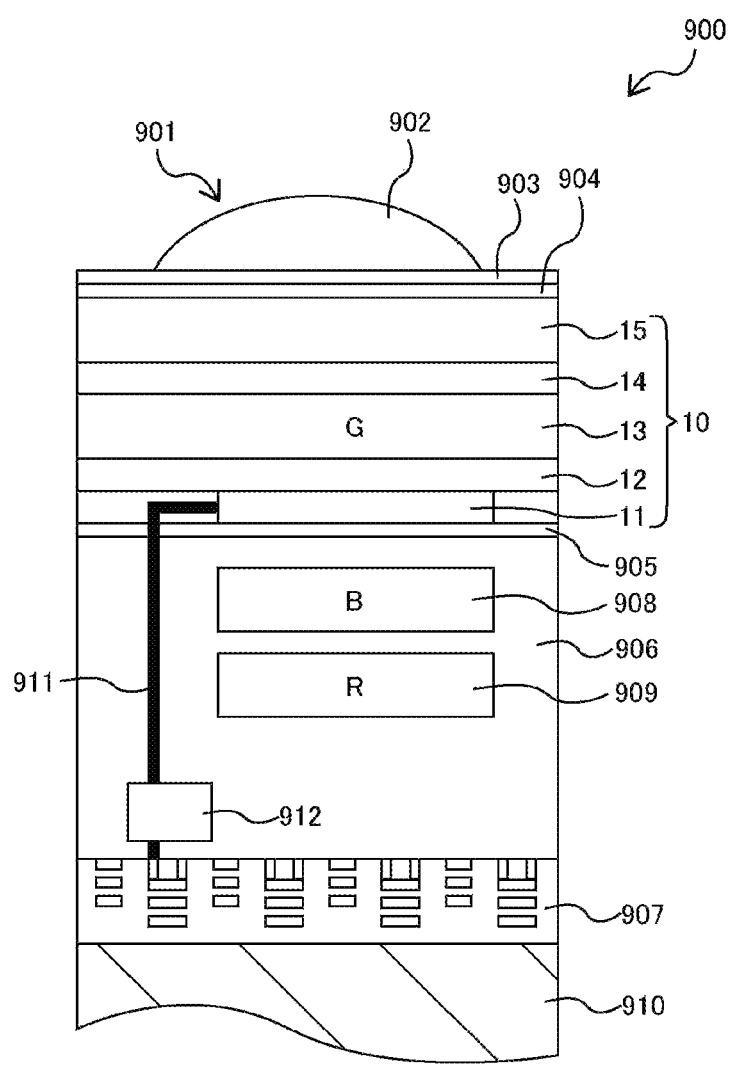
FIG. 10 is a cross-sectional view showing a configuration example of a solid-state imaging element of a second embodiment to which the present technology is applied.

FIG. 10 is a cross-sectional view showing a configuration example of a solid-state imaging element of a second embodiment to which the present technology is applied. A solid-state imaging element 900 of the present embodiment will now be described using FIG. 10.

[2-1. Back-Side Illumination Solid-State Imaging Element]

FIG. 10 shows one pixel 901 of a plurality of pixels included in a back-side illumination solid-state imaging element 900 such as a CMOS image sensor, as an example. The pixel 901 includes, in the depth direction from the light

TABLE 5

| | Classification of quinacridone material used | Constituent substances of photo-electric conversion layer | | | External quantum efficiency (in case where Example 1 is set to 1) | Time of fall of signal intensity from 100 to 3% (in case where Example 1 is set to 1) | Grain size of QD derivative | Orientation parameter S |
|---|---|---|---|---|---|---|---|---|
| Comparative Example 5 | HH | BQD | — | F6SubPcCl | 0.88 | 10 | 1.3 | 0.004 |
| Comparative Example 6 | RR + HH | DMQD | BQD | F6SubPcCl | 0.5 | 44 | 1.5 | 0.09 |
| Comparative Example 7 | RR + HH | DPQD | BQD | F6SubPcCl | 0.1 | 100 | 1.2 | 0.015 |
| Comparative Example 8 | HH + HH | EQD | BQD | F6SubPcCl | 0.8 | 60 | 1.6 | 0.037 |

From Comparative Examples 5 to 8 of Table 5, it has been found that, in a case where the crystal grain size of the quinacridone derivative is less than or equal to 1.6 nm, even if the orientation parameter S is a value near S=0, the receiving surface of the solid-state imaging element 900, an on-chip lens (OCL) 902, a flattening layer 903, a protection layer 904, the organic photo-electric conversion element 10, an insulating film 905, a semiconductor substrate (silicon substrate) 906, and a multiple-layer interconnection layer 907. Further, a first photodiode 908 and a second photodiode 909 that are two inorganic photo-electric conversion units each having a p-n junction are formed in the semiconductor substrate 906. Then, for example, a support substrate 910 containing silicon is stuck to the multiple-layer interconnection layer 907.

A light receiving surface on which light is incident is formed on the back surface side of the semiconductor substrate 906 (the upper side of the semiconductor substrate 906 in FIG. 10), and a circuit including a readout circuit etc. is formed on the front surface side of the semiconductor substrate 906 (the lower side of the semiconductor substrate 906 in FIG. 10). That is, the pixel 901 has a light receiving surface on the back surface side of the semiconductor substrate 906 and a circuit formation surface on the front surface side of the semiconductor substrate 906. The semiconductor substrate 906 may contain, for example, a semiconductor of either of a p-type and an n-type, with a first electrically conductive type defined as the p-type and a second electrically conductive type as the n-type.

In the semiconductor substrate 906 of the present embodiment, first the first photodiode 908 is formed and next the second photodiode 909 is formed in the depth direction (the down direction in FIG. 10) from the back surface side of the semiconductor substrate 906. In FIG. 10, the first photodiode 908 is for blue color (B), and the second photodiode 909 is for red color (R).

The organic photo-electric conversion element 10 in which the first electrode (lower electrode) 11, the first buffer layer 12, the organic photo-electric conversion layer 13, the second buffer layer 14, and the second electrode (upper electrode) 15 are stacked in this order is provided on the upper side of the back surface of the semiconductor substrate 906 in which the first photodiode 908 and the second photodiode 909 are formed. In the solid-state imaging element 900 of the present embodiment, the organic photo-electric conversion element 10 is for green color (G). Each of the first electrode 11 and the second electrode in the organic photo-electric conversion element 10 may include a transparent electrically conductive film such as an indium tin oxide film or an indium zinc oxide film, for example. Note that the organic photo-electric conversion layer 13 is a light absorbing layer for photo-electrically converting incident light; for visible wavelengths, usually crystalline silicon (Si) is used.

As a combination of colors, although in the solid-state imaging element 900 of the present embodiment the organic photo-electric conversion element 10 is for green color, the first photodiode 908 is for blue color, and the second photodiode 909 is for red color, other color combinations are possible. For example, the organic photo-electric conversion element 10 may be set for red color or blue color, and the first photodiode 908 and the second photodiode 909 may be set for other corresponding colors. In this case, the positions in the depth direction of the first photodiode 908 and the second photodiode 909 are set in accordance with the colors.

Further, an organic photo-electric conversion element 10UV for ultraviolet light and/or an organic photo-electric conversion element 10IR for infrared light may be used for the solid-state imaging element (a back-side illumination solid-state imaging element and a front-side illumination solid-state imaging element) of the second embodiment according to the present technology, in addition to an organic photo-electric conversion element 10B for blue color, an organic photo-electric conversion element 10G for green color, and an organic photo-electric conversion element 10R for red color. By providing the organic photo-electric conversion element 10UV for ultraviolet light and/or the organic photo-electric conversion element 10IR for infrared light, light of a wavelength other than the visible light region can be detected.

In the pixel 901, an interconnection 911 connected to the first electrode 11 and an interconnection (not illustrated) connected to the second electrode 15 are formed. In order to suppress a short circuit with Si, each of the interconnection 911 and the interconnection connected to the second electrode 15 may be formed using, for example, a tungsten (W) plug provided with a $SiO_2$ or SiN insulating layer therearound, a semiconductor layer based on ion implantation, or the like. In the solid-state imaging element 900 of the present embodiment, the signal charge is holes; hence, the interconnection 911 is a p-type semiconductor layer in a case where the interconnection 911 is formed using a semiconductor layer based on ion implantation. An n-type semiconductor layer may be used for the interconnection connected to the second electrode 15, because the second electrode 15 extracts electrons.

In the present embodiment, an n-type region 912 for charge accumulation is formed on the front surface side in the semiconductor substrate 906. The n-type region 910 functions as a floating diffusion unit of the organic photo-electric conversion element 10.

A film having a negative fixed charge may be used as the insulating film 905 on the back surface of the semiconductor substrate 906. A hafnium oxide film may be used as the film having a negative fixed charge, for example. That is, the insulating film 905 hay have a three-layer structure in which a silicon oxide film, a hafnium oxide film, and a silicon oxide film are sequentially formed as films from the back surface side of the semiconductor substrate 906.

Further, without using the first photodiode 908 or the second photodiode 909, three photo-electric conversion elements, that is, the organic photo-electric conversion element 10B for blue color, the organic photo-electric conversion element 10G for green color, and the organic photo-electric conversion element 10R for red color may be used in the solid-state imaging element (a back-side illumination solid-state imaging element and a front-side illumination solid-state imaging element) of the second embodiment according to the present technology. As the organic photo-electric conversion element 10R that performs photo-electric conversion with red wavelength light, for example, an organic photo-electric conversion material containing a phthalocyanine-based dye may be used. As the organic photo-electric conversion element 10G that performs photo-electric conversion with green wavelength light, for example, an organic photo-electric conversion material containing a rhodamine-based dye, a merocyanine-based dye, quinacridone, or the like may be used. As the organic photo-electric conversion element 10B that performs photo-electric conversion with blue wavelength light, for example, an organic photo-electric conversion material containing a coumarin-based dye, tris(8-hydroxyquinolinato)Al (Alq3), a merocyanine-based dye, or the like may be used.

[2-2. Front-Side Illumination Solid-State Imaging Element]

The solid-state imaging element of the second embodiment according to the present technology may be used for not only the back-side illumination solid-state imaging element 900 described above but also a front-side illumination solid-state imaging element.

A configuration example of a front-side illumination solid-state imaging element differs from the back-side illumination solid-state imaging element 900, in which the multiple-layer interconnection layer 910 is formed on the lower side of the semiconductor substrate 906, only in that the multiple-layer interconnection layer 910 is formed between the organic photo-electric conversion element 10 and the semiconductor substrate 906. The other configuration of the front-side illumination solid-state imaging element is similar to the configuration of the back-side illumination solid-state imaging element 900, and therefore a description is omitted herein.

<3. Third Embodiment (Electronic Apparatus)>

An electronic apparatus of a third embodiment according to the present technology is an electronic apparatus in which solid-state imaging elements of the second embodiment according to the present technology are mounted and the solid-state imaging elements, in each of which at least the photo-electric conversion element of the first embodiment according to the present technology and a semiconductor substrate are stacked, are provided individually for a plurality of one-dimensionally or two-dimensionally arranged pixels. The electronic apparatus of the third embodiment according to the present technology includes a solid-state imaging element in which responsiveness and external quantum efficiency are improved, and can therefore improve performance such as the image quality of a color image.

<4. Use Examples of Solid-State Imaging Element to which Present Technology is Applied>

Figure 11:
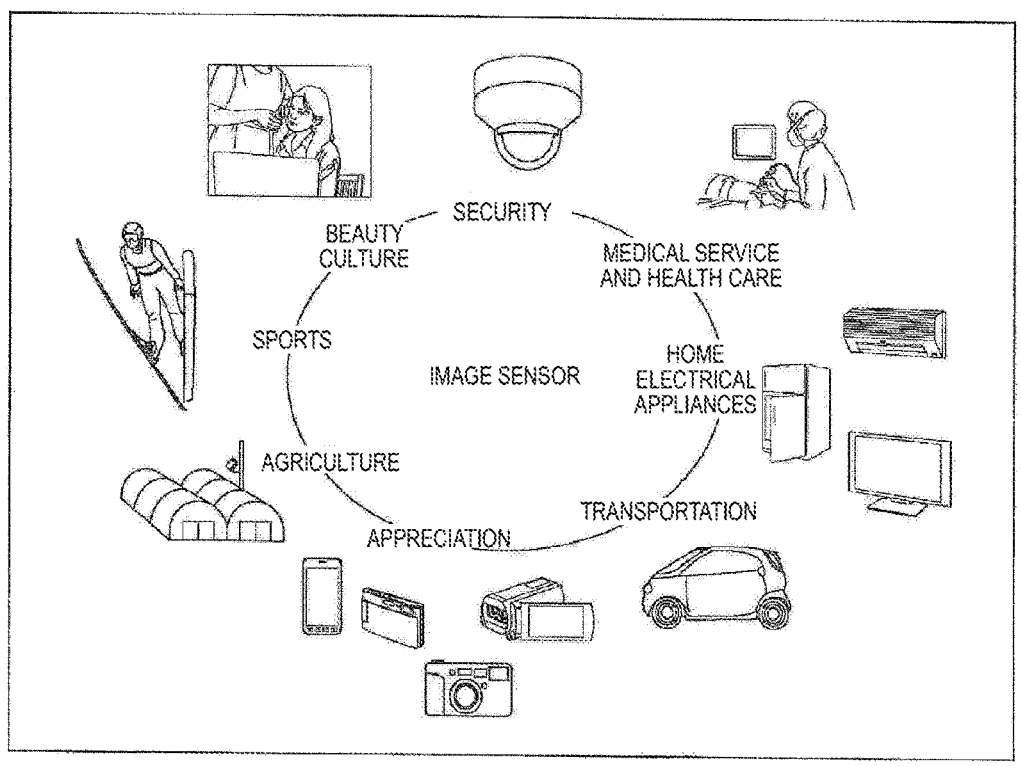
FIG. 11 is a diagram showing use examples of a solid-state imaging element of the second embodiment to which the present technology is applied.

FIG. 11 is a diagram showing use examples of the solid-state imaging element of the second embodiment according to the present technology, as an image sensor.

The solid-state imaging element of the second embodiment described above can be used for, for example, various cases where light such as visible light, infrared light, ultraviolet light, or X-rays is sensed, as shown below. That is, as shown in FIG. 11, the solid-state imaging element of the second embodiment can be used for an apparatus (for example, the electronic apparatus of the third embodiment described above) used in the field of appreciation in which images used for appreciation are photographed, the field of transportation, the field of home electrical appliances, the field of medical service and health care, the field of security, the field of beauty culture, the field of sports, the field of agriculture, etc., for example.

Specifically, in the field of appreciation, for example, the solid-state imaging element of the second embodiment can be used for an apparatus for photographing images used for appreciation, such as a digital camera, a smartphone, or a mobile phone provided with a camera function.

In the field of transportation, for example, the solid-state imaging element of the second embodiment can be used for an apparatus used for transportation for safe driving such as automatic stopping, the recognition of the state of a driver, etc., such as a car-mounted sensor that photographs the front side, the rear side, the surroundings, the inside, etc. of an automobile, a surveillance camera that monitors moving vehicles and a road, or a distance measuring sensor that performs distance measuring of the distance between vehicles or the like.

In the field of home electrical appliances, for example, the solid-state imaging element of the second embodiment can be used for an apparatus used for home electrical appliances in order to photograph a gesture of a user and perform device operation in accordance with the gesture, such as a television, a refrigerator, or an air conditioner.

In the field of medical service and health care, for example, the solid-state imaging element of the second embodiment can be used for an apparatus used for medical service and health care, such as an endoscope or an apparatus that performs blood vessel photographing by receiving infrared light.

In the field of security, for example, the solid-state imaging element of the second embodiment can be used for an apparatus used for security, such as a surveillance camera for crime prevention use or a camera for person authentication use.

In the field of beauty culture, for example, the solid-state imaging element of the second embodiment can be used for an apparatus used for beauty culture, such as a skin measuring device that photographs a skin or a microscope that photographs the scalp.

In the field of sports, for example, the solid-state imaging element of the second embodiment can be used for an apparatus used for sports, such as an action camera or a wearable camera for sports use or the like.

In the field of agriculture, for example, the solid-state imaging element of the second embodiment can be used for an apparatus used for agriculture, such as a camera for monitoring the state of a farm and crops.

The technology according to the present disclosure (the present technology) can be applied to various products. In the following, an application example to an endoscopic surgery system and an application example to mobile bodies are described.

<5. Application Example to Endoscopic Surgery System>

The present disclosure technology can be applied to the endoscopic surgery system.

Figure 12:
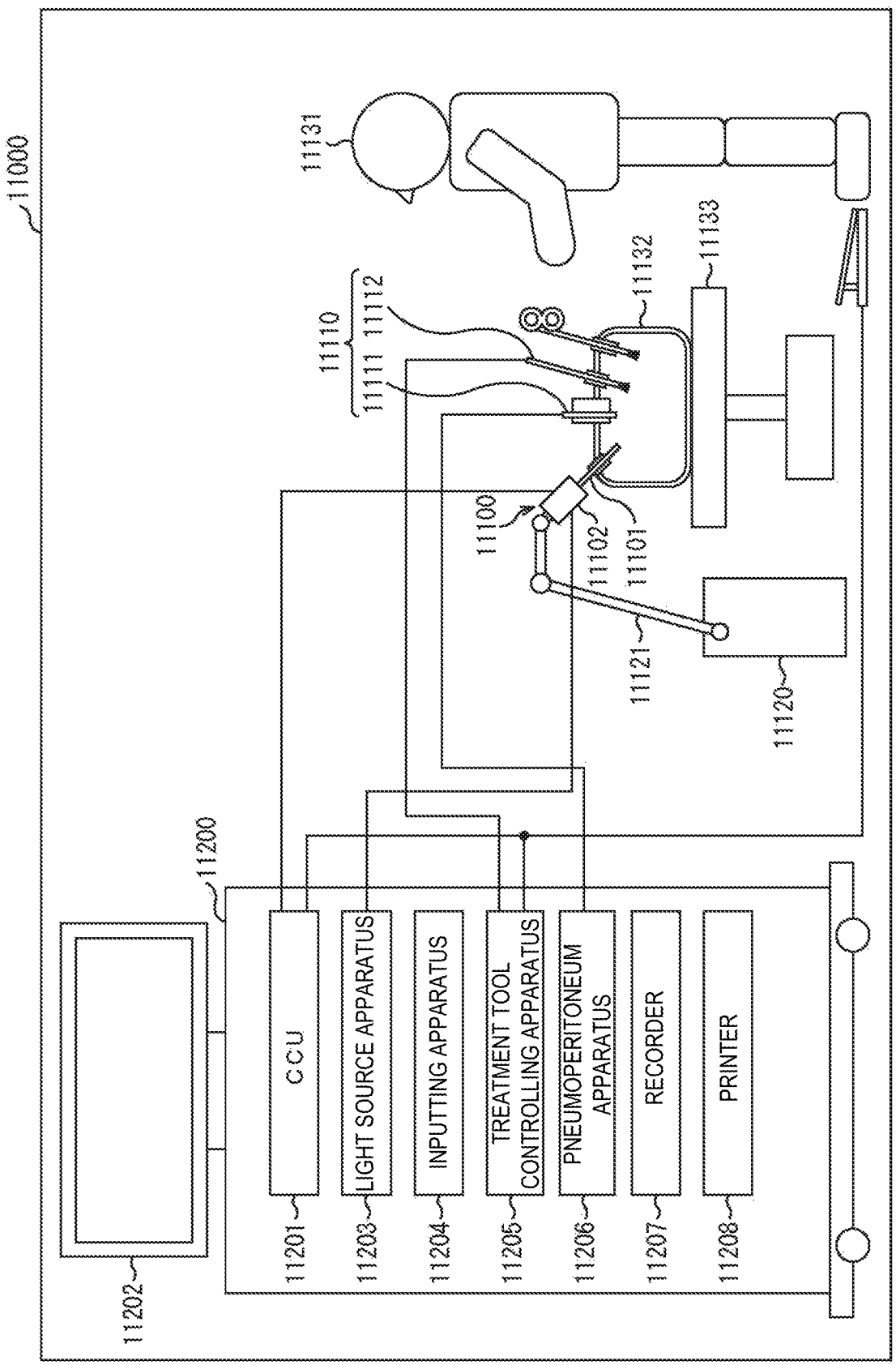
FIG. 12 is a view depicting an example of a schematic configuration of an endoscopic surgery system to which the present technology is applied.

FIG. 12 is a view depicting an example of a schematic configuration of an endoscopic surgery system to which the technology according to an embodiment of the present disclosure (present technology) can be applied.

In FIG. 12, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 13:
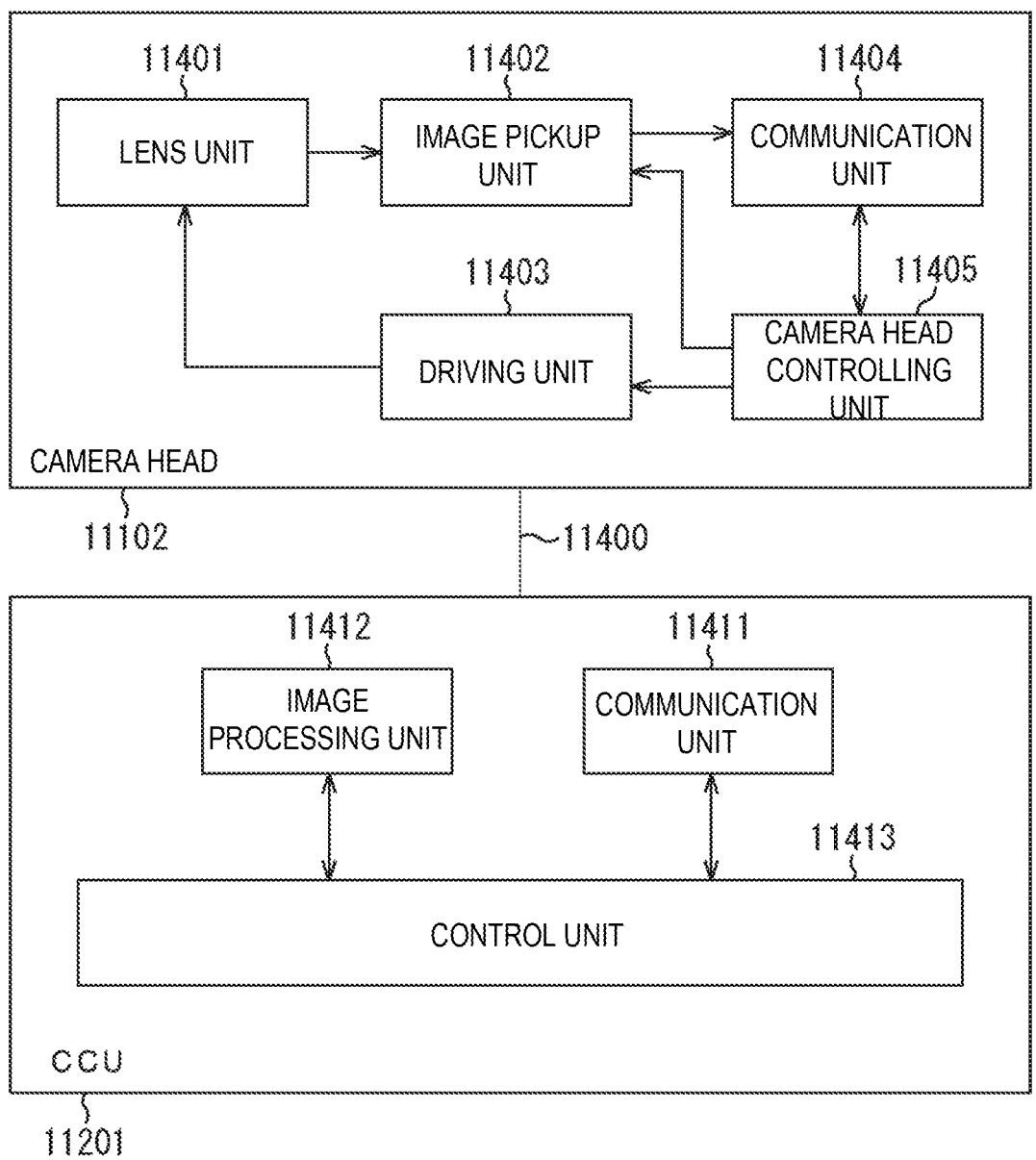
FIG. 13 is a block diagram depicting an example of a functional configuration of a camera head and a camera control unit (CCU) to which the present technology is applied.

FIG. 13 is a block diagram depicting an example of a functional configuration of the camera head 11102 and the CCU 11201 depicted in FIG. 12.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The image pickup unit 11402 includes image pickup elements. The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

Hereinabove, an example of an endoscopic surgery system to which the technology according to the present disclosure can be applied is described. The technology according to the present disclosure can be applied to, of the configuration described above, the imaging unit 11402 of the camera head 11102. Specifically, the solid-state imaging element according to the present technology can be used for the imaging unit 11402. By applying the technology according to the present disclosure to the imaging unit 11402, a clearer surgical region image can be obtained, and therefore the surgeon can check the surgical region with certainty.

Note that, although the endoscopic surgery system has been described as an example herein, the technology according to the present disclosure may also be applied to others, for example, a microscope surgery system, and the like.

<6. Application Example to Mobile Bodies>

The technology according to the present disclosure can be implemented as apparatuses mounted on any type of mobile bodies such as automobiles, electric vehicles, hybrid electric vehicles, motorcycles, bicycles, personal mobilities, airplanes, drones, ships, and robots.

Figure 14:
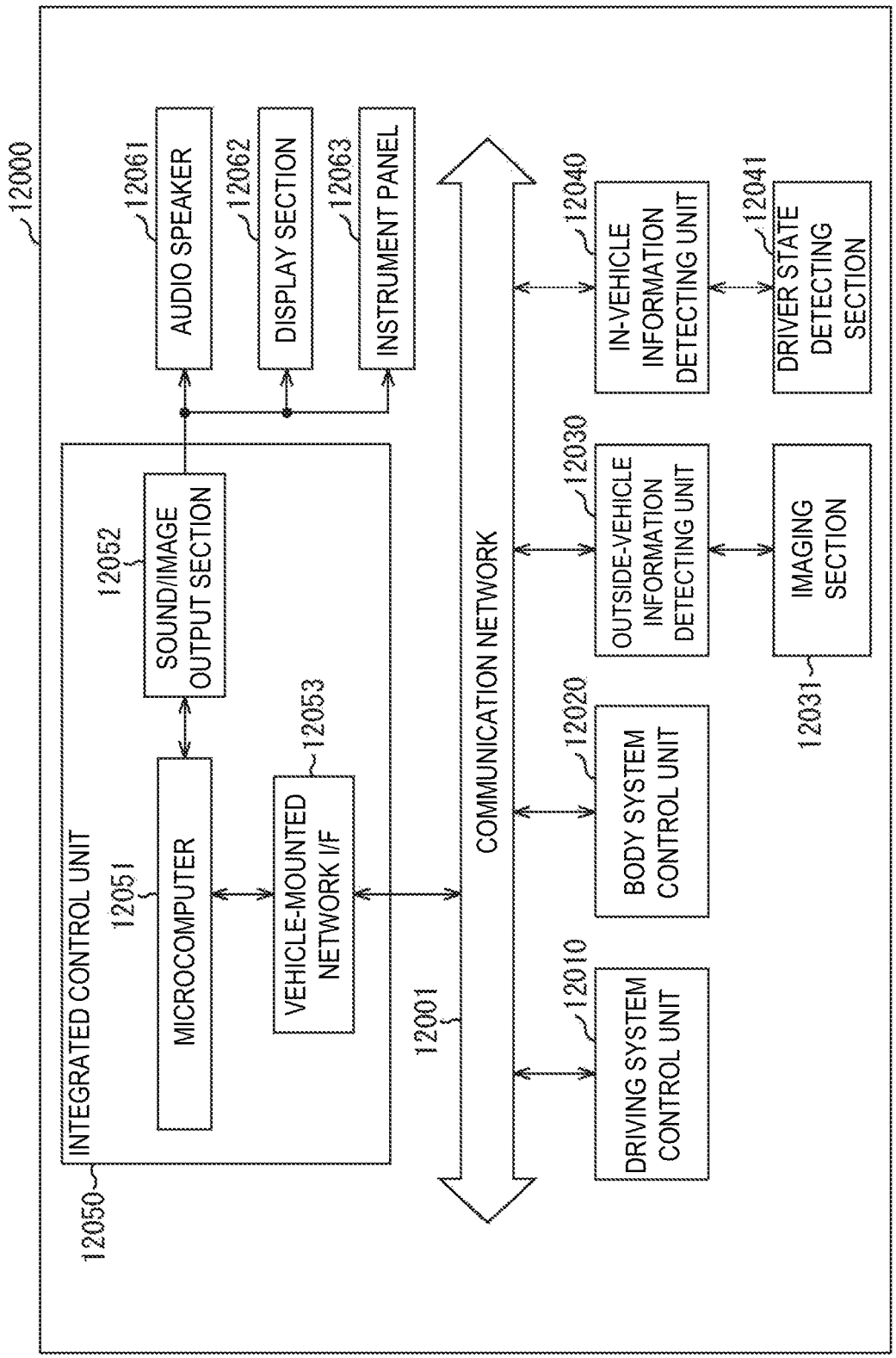
FIG. 14 is a block diagram depicting an example of schematic configuration of a vehicle control system to which the present technology is applied.

FIG. 14 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 14, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound or an image to an output device capable of visually or auditorily notifying information to an occupant of the vehicle or the outside of the vehicle. In the example of FIG. 14, an audio speaker 12061, a display section 12062, and an instrument panel 12063 are illustrated as the output device. The display section 12062 may, for example, include at least one of an on-board display or a head-up display.

Figure 15:
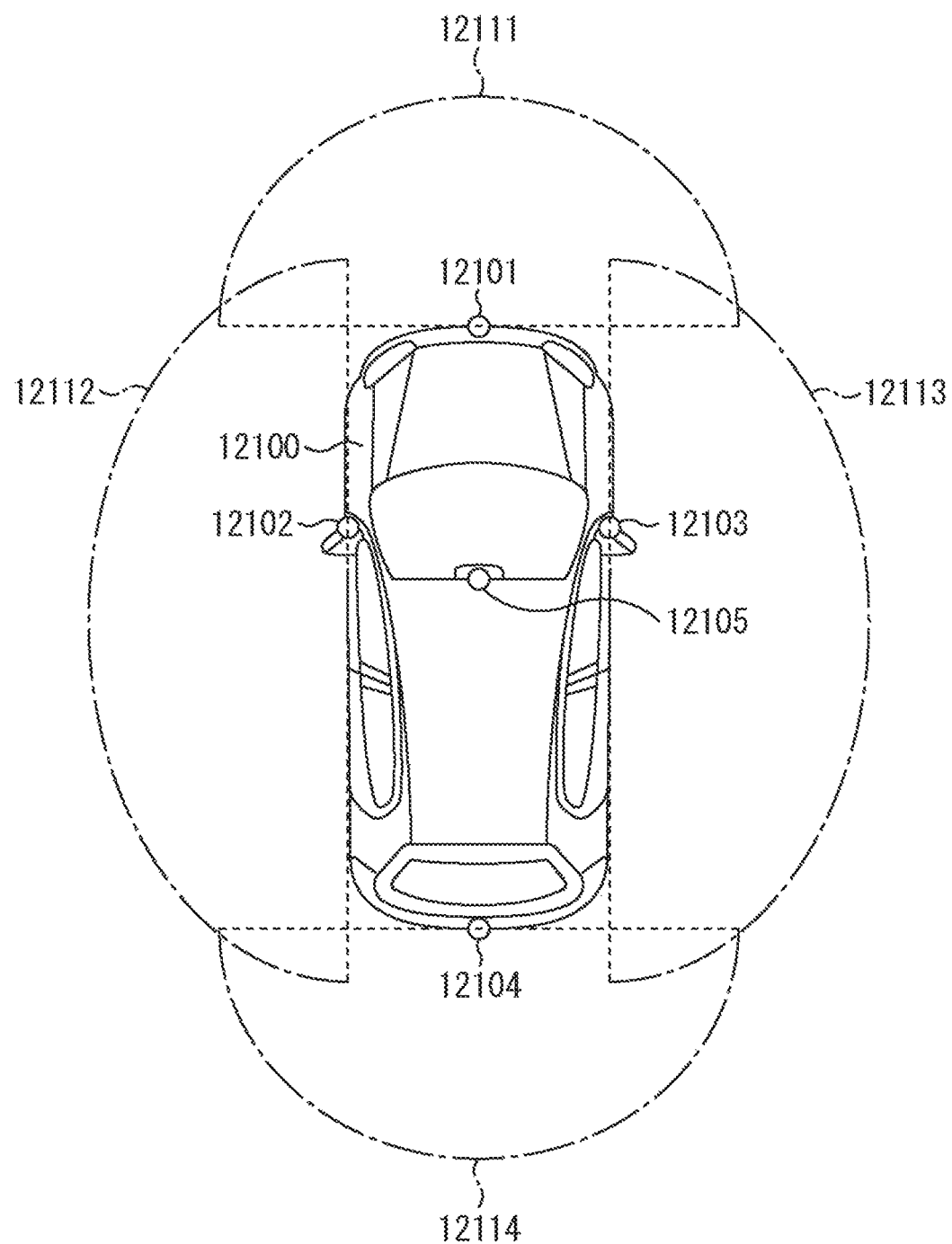
FIG. 15 is a diagram of assistance in explaining an example of installation positions of an outside-vehicle information detecting section and an imaging section to which the present technology is applied.

FIG. 15 is a diagram depicting an example of the installation position of the imaging section 12031.

In FIG. 15, the vehicle 12100 includes imaging sections 12101, 12102, 12103, 12104, and 12105 as the imaging section 12031.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 15 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

Hereinabove, an example of a vehicle control system to which the technology according to the present disclosure can be applied is described. The technology according to the present disclosure can be applied to, of the configuration described above, the imaging unit 12031 (the imaging units 12101, 12102, 12103, 12104, and 12105). Specifically, the solid-state imaging element according to the present technology can be used for the imaging unit 12031 (the imaging units 12101, 12102, 12103, 12104, and 12105). By applying the technology according to the present disclosure to the imaging unit 12031 (the imaging units 12101, 12102, 12103, 12104, and 12105), a more easily viewable photographed image can be obtained, and therefore the fatigue of the driver can be reduced.

Note that the embodiment according to the present technology is not limited to the embodiments described above, and may include various alterations without departing from the spirit of the present technology.

Further, the effects described in the present specification are only examples and are not limitative ones, and there may be other effects.

Additionally, the present technology may also be configured as below.

[1]
A photo-electric conversion element including:
an organic photo-electric conversion layer sandwiched by a first electrode and a second electrode,
in which the organic photo-electric conversion layer contains organic molecules of a quinacridone derivative and a subphthalocyanine derivative, and
at least the quinacridone derivative out of the organic molecules is in random orientation.

[2]
The photo-electric conversion element according to [1],
in which a crystal grain size of the quinacridone derivative is 2 to 5 nm.

[3]
The photo-electric conversion element according to [1],
in which further the subphthalocyanine derivative is in random orientation.

[4]
The photo-electric conversion element according to [1],
in which the random orientation is orientation of a direction in which an angle between an average orientation of transition dipole moments of the quinacridone derivative and a normal-to-stacking-plane line of the organic photo-electric conversion layer is 50° to 60°.

[5]
The photo-electric conversion element according to
in which the organic molecules include two or more kinds of quinacridone derivative.

[6]
The photo-electric conversion element according to [1],
in which the quinacridone derivative includes at least two of 2,9-diethylquinacridone (EQD), 2,9-di-tert-butylquinacridone (BQD), N,N'-dimethylquinacridone (DMQD), N,N'-diphenylquinacridone (DPQD), N,N'-diphenyl-2,9-di-tert-butylquinacridone (BPQD), N-methylquinacridone (MMQD), N-methyl-2,9-dimethylquinacridone (TMQD), N-methyl-2,9-di-tert-butylquinacridone (BMQD), and N-phenylquinacridone (MPQD).

[7]
The photo-electric conversion element according to [1],
in which the subphthalocyanine derivative is any one of hexafluoroboron subphthalocyanine chloride (F6-SubPc-Cl), hexafluoroboron subphthalocyanine-4-chlorophenoxide (F6-SubPc-OPh), boron subphthalocyanine chloride (SubPc-Cl), and hexafluoroboron subphthalocyanine-4-chlorophenoxide (SubPc-OPh).

[8]
A solid-state imaging element including at least:
the photo-electric conversion element according to [1]; and
a semiconductor substrate,
in which the photo-electric conversion element and the semiconductor substrate are stacked for each of a plurality of one-dimensionally or two-dimensionally arranged pixels.

[9]
An electronic apparatus including:
the solid-state imaging element according to [8].

REFERENCE SIGNS LIST 10 photo-electric conversion element
11 first electrode
12 first buffer layer
13 organic photo-electric conversion layer
14 second buffer layer
15 second electrode
20, 51 quinacridone (QD)
21, 22, 23, 26, 27 layer
41 shape-anisotropic grain
52 axis
900 solid-state imaging element
901 pixel
902 on-chip lens (OCL)
903 flattening layer
904 protection layer
905 insulating film
906 semiconductor substrate
907 multiple-layer interconnection layer
908, 909 photodiode
910 support substrate
911 interconnection
912 n-type region

What is claimed is:

1. A photo-electric conversion element comprising:
an organic photo-electric conversion layer sandwiched by a first electrode and a second electrode,
wherein the organic photo-electric conversion layer contains organic molecules of a quinacridone derivative and a subphthalocyanine derivative,
wherein at least the quinacridone derivative out of the organic molecules is in random orientation, and
wherein a crystal grain size of the quinacridone derivative is 2 to 5 nm.

2. The photo-electric conversion element according to claim 1,
wherein further the subphthalocyanine derivative is in random orientation.

3. The photo-electric conversion element according to claim 1,
wherein the random orientation is orientation of a direction in which an angle between an average orientation of transition dipole moments of the quinacridone derivative and a normal-to-stacking-plane line of the organic photo-electric conversion layer is 50° to 60°.

4. The photo-electric conversion element according to claim 1,
wherein the organic molecules include two or more kinds of quinacridone derivative.

5. The photo-electric conversion element according to claim 1,
wherein the quinacridone derivative includes at least two of 2,9-diethylquinacridone (EQD), 2,9-di-tert-butylquinacridone (BQD), N,N'-dimethylquinacridone (DMQD), N,N'-diphenylquinacridone (DPQD), N,N'-diphenyl-2,9-di-tert-butylquinacridone (BPQD), N-methylquinacridone (MMQD), N-methyl-2,9-dimethylquinacridone (TMQD), N-methyl-2,9-di-tert-butylquinacridone (BMQD), and N-phenylquinacridone (MPQD).

6. The photo-electric conversion element according to claim 1,
wherein the subphthalocyanine derivative is any one of hexafluoroboron subphthalocyanine chloride (F6-SubPc-Cl), hexafluoroboron subphthalocyanine-4-chlorophenoxide (F6-SubPc-OPh), boron subphthalocyanine chloride (SubPc-Cl), and hexafluoroboron subphthalocyanine-4-chlorophenoxide (SubPc-OPh).

7. A solid-state imaging element comprising at least:
the photo-electric conversion element according to claim 1; and
a semiconductor substrate,
wherein the photo-electric conversion element and the semiconductor substrate are stacked for each of a plurality of one-dimensionally or two-dimensionally arranged pixels.

8. An electronic apparatus comprising:
the solid-state imaging element according to claim 7.

* * * * *